United States Patent
Gilmore et al.

(10) Patent No.: US 7,768,751 B2
(45) Date of Patent: Aug. 3, 2010

(54) SYSTEM AND METHOD FOR GROUND FAULT DETECTION AND INTERRUPTION

(75) Inventors: Jack A. Gilmore, Fort Collins, CO (US); Eric Seymour, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 299 days.

(21) Appl. No.: 12/022,147

(22) Filed: Jan. 29, 2008

(65) Prior Publication Data

US 2009/0190275 A1 Jul. 30, 2009

(51) Int. Cl.
H02H 3/16 (2006.01)
(52) U.S. Cl. .......................... 361/42; 361/44
(58) Field of Classification Search ........... 361/42–50; 136/244, 245
See application file for complete search history.

(56) References Cited

U.S. PATENT DOCUMENTS

| | | | |
|---|---|---|---|
| 6,812,396 B2 | 11/2004 | Makita | |
| 7,053,506 B2 | 5/2006 | Alonso | |
| 7,292,419 B1 * | 11/2007 | Nemir | 361/42 |
| 2001/0004322 A1 | 6/2001 | Kurokami | |
| 2001/0048605 A1 * | 12/2001 | Kurokami et al. | 363/56.03 |
| 2002/0105765 A1 * | 8/2002 | Kondo et al. | 361/42 |
| 2005/0139259 A1 | 6/2005 | Steigerwald | |
| 2006/0227472 A1 | 10/2006 | Taylor | |

FOREIGN PATENT DOCUMENTS

JP 2006187150 A * 7/2006

OTHER PUBLICATIONS

Gilmore, Jack, "System, Method, and Apparatus for coupling Photovoltaic Arrays", U.S. Appl. No. 12/184,535, filed Aug. 1, 2008, commonly assigned to assignee.
Han, Sang L, "International Search Report and Written Opinion", Aug. 17, 2009.

* cited by examiner

Primary Examiner—Danny Nguyen
(74) Attorney, Agent, or Firm—Sean R. O'Dowd; Neugeboren O'Dowd PC

(57) ABSTRACT

A ground fault detector and interrupter for a photovoltaic (PV) energy conversion system, method and apparatus are disclosed. In an exemplary embodiment, the system includes first and second inputs adapted to couple to a first and second rails of a PV array. An inverter is configured to convert DC power generated from the PV array to AC power. A ground fault detector and interrupter, which is coupled to the first and second rails and to the inverter, is configured to detect ground fault conditions in the PV array and to decouple the PV array from the remaining portion of the PV energy conversion system upon such detection. A known signal is coupled to the input of the ground fault detector and interrupter, and then sensed at the output of the ground fault detector and interrupter to determine whether components of the ground fault detector and interrupter are operating properly.

15 Claims, 8 Drawing Sheets

SYSTEM AND METHOD FOR GROUND FAULT DETECTION AND INTERRUPTION

FIELD OF THE INVENTION

This invention relates generally to apparatus and methods for converting solar energy to electrical energy, and more specifically to apparatus and methods for reliably detecting unsafe ground fault conditions and interrupting operation of such energy conversion systems when unsafe ground fault conditions are detected.

BACKGROUND OF THE INVENTION

The transformation of light energy into electrical energy using photovoltaic (PV) systems has been known for a long time and such photovoltaic energy conversion systems are increasingly being implemented in residential, commercial, and industrial applications. Rapid detection of unintended shunting of DC current to ground, also known as a ground fault, is mandatory for implementation of such systems because ground faults present potentially dangerous conditions, including fire risk. Accordingly, for safety reasons photovoltaic energy conversion systems must rapidly detect ground fault conditions and automatically interrupt operation when appropriate.

Photovoltaic systems typically include, among other components, a photovoltaic array that generates DC power and an inverter that converts the DC power to AC power (e.g., single phase or three phase power). In such systems, a ground fault detector and interrupter (GFDI) is typically employed to detect DC current flowing between the PV array and ground. Some of the components used in a ground fault detector and interrupter are not capable of being certified as high integrity components, which means that the reliability of such components as used in the ground fault detector and interrupter is not guaranteed to be at an acceptable level. Because the ground fault detector and interrupter is often critical to the safe operation of the PV energy conversion system, measures must be taken to ensure that the ground fault detector and interrupter operates correctly at all times. Accordingly, apparatus and methods are needed to ensure continuously that the ground fault detector and interrupter is operating correctly.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In one embodiment, the invention may be characterized as a photovoltaic energy conversion system including a first and second inputs adapted to couple to a first and second rails of a photovoltaic array. In this embodiment, an inverter is configured to convert DC power from the photovoltaic array to AC power. A ground fault detector and interrupter, which is coupled to the first and second rails and to the inverter, is configured to detect ground fault conditions in the PV array and to decouple the PV array from the remaining portion of photovoltaic energy conversion system upon such detection. A known signal (e.g., a signal having a recognizable signature), is coupled to the input of the ground fault detector and interrupter, and then sensed at the output of the ground fault detector and interrupter. If the known signal is not sensed at the output of the ground fault detector and interrupter, then that indicates that the ground fault detector and interrupter is not operating correctly, and the PV array will be decoupled from the remaining components in the PV energy conversion system thereby interrupting operation.

In another embodiment the invention may be characterized as a method to ensure that a ground fault detector and interrupter is operating correctly. The invention in this embodiment includes introducing a known signal into the input of a ground fault detector and interrupter, sensing whether the known signal at the output of the ground fault detector and interrupter is present, and then branching depending on whether the known signal is present at the output of the ground fault detector and interrupter: If the known signal is present, then filtering out the known signal and transmitting the filtered signal to the inverter; but if the known signal is not present, then decoupling the PV array from the remaining components in the PV energy conversion system, and issuing an alert that the ground fault detector and interrupter is not operating properly.

In another embodiment, the invention may be characterized as a method to safely and effectively decouple a bipolar photovoltaic array from the remainder of a photovoltaic energy conversion system upon detection of a ground fault condition that requires interruption of the system.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
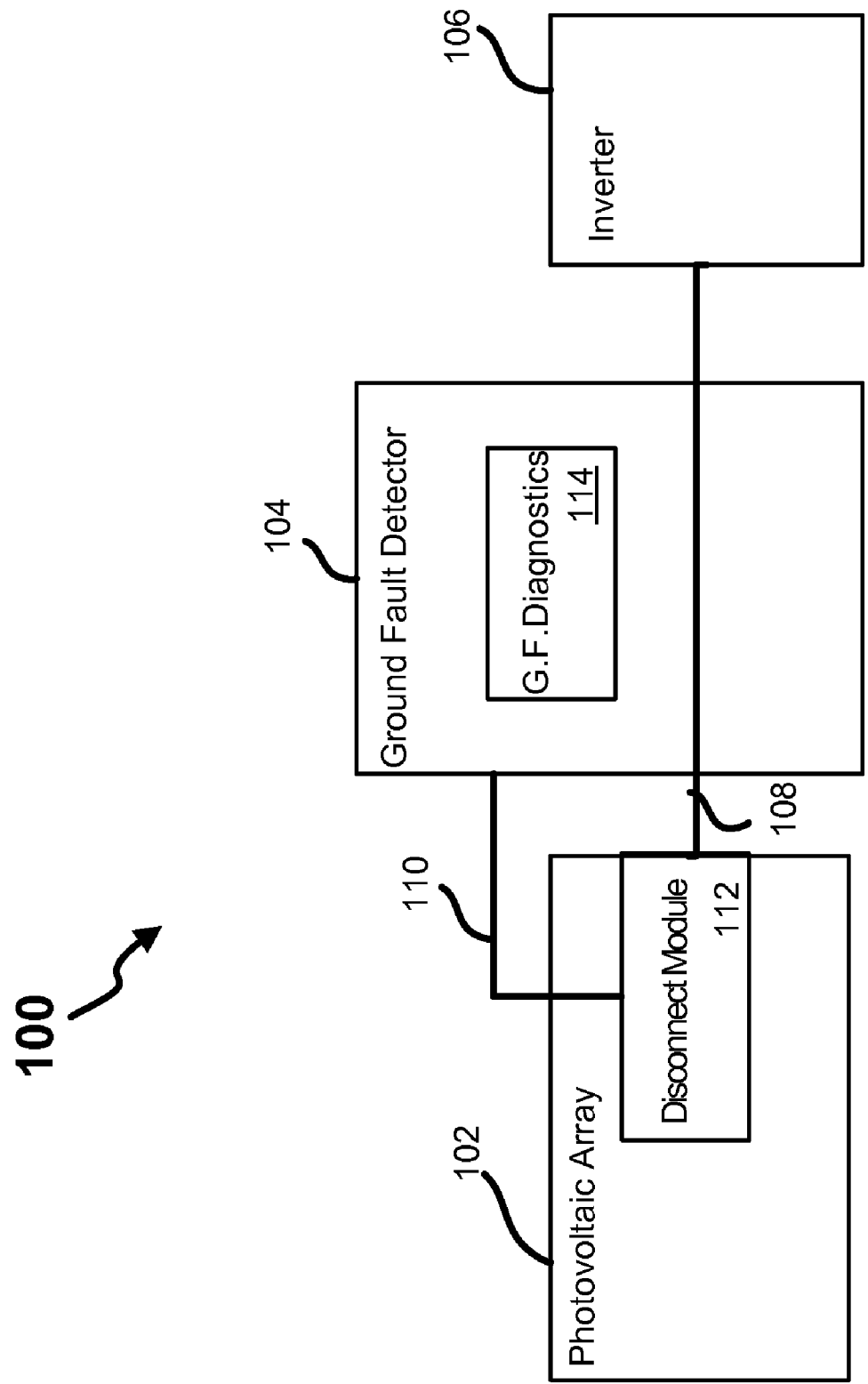
FIG. 1 is a block diagram depicting an exemplary embodiment of a photovoltaic energy conversion system comprising a ground fault detector and interrupter.

Referring now to the drawings, where like or similar elements are designated with identical or corresponding reference numerals throughout the several views, and referring in particular to FIG. 1, shown is a block diagram depicting a photovoltaic power conversion system 100 that includes a photovoltaic array 102 coupled to an inverter 106. Coupled between the photovoltaic array 102 and the inverter 106 is a ground fault detector and interrupter 104. Conductor lines 108 couple the photovoltaic array 102 to the inverter 106, and the ground fault detector and interrupter 104 is coupled (e.g., inductively coupled) to the conductor lines 108. As shown, the ground fault detector and interrupter 104 includes a diagnostics portion 114, and the ground fault detector and interrupter 104 is coupled to a disconnect module 112 via a ground fault signal line 110.

It should be recognized that the illustrated arrangement of the components depicted in FIG. 1 is logical and not meant to be an actual hardware diagram; thus, the components can be combined or further separated in an actual implementation. For example, the ground fault detector 104 may be realized by hardware and/or software that is also used within the inverter 106. And in some implementations, the disconnect module 112 may be spatially separated from the photovoltaic array 102.

In general, the photovoltaic array 102 converts solar energy to DC electrical current, which is converted to AC power (e.g., single phase or three-phase power) by the inverter 106. The photovoltaic array 102 may be either a mono-polar or a bipolar array. The ground fault detector and interrupter 104 detects unsafe ground fault conditions and acts rapidly to cease the unsafe flow of DC current from the array 102 to ground. In many embodiments for example, the ground fault detector and interrupter 104 senses a ground fault and sends a ground fault signal 110 to the disconnect module 112 to isolate the array 102 (e.g., from ground and the inverter 106).

The diagnostics portion 114 is configured to test whether the ground fault detector and interrupter 104 is operating properly (e.g., operating to detect ground faults), and if the ground fault detector and interrupter 104 is not operating properly, the ground fault diagnostics portion 114 sends a ground fault signal 110 to the disconnect module 112 to take the array 102 offline.

Figure 2:
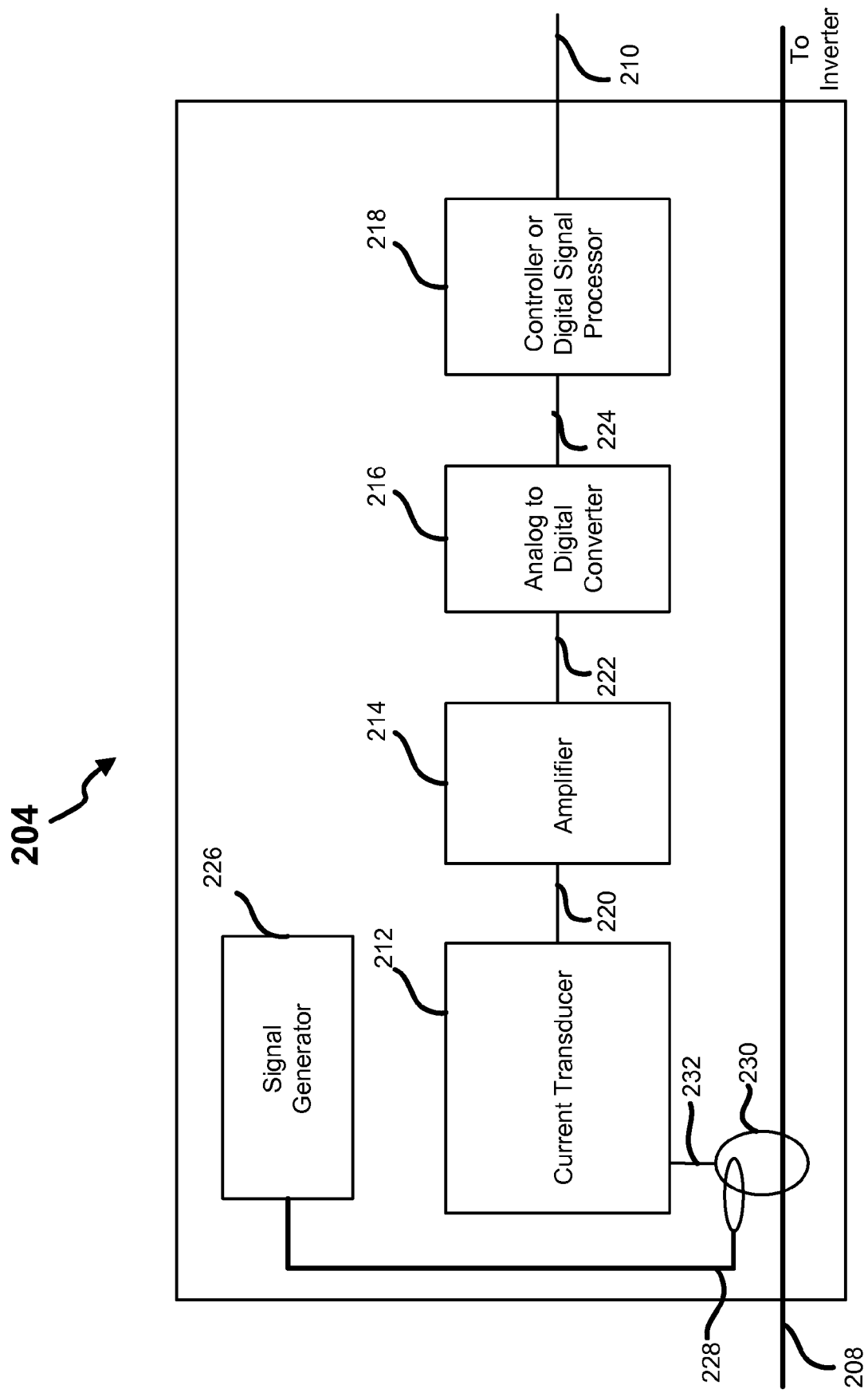
FIG. 2 is a block diagram depicting an exemplary embodiment of the ground fault detector and interrupter described with reference to FIG. 1.

Referring next to FIG. 2, shown is a block diagram representation of an exemplary embodiment of the ground fault detector and interrupter 104 of the system 100 described with reference to FIG. 1. As shown in the ground fault detector and interrupter 204 depicted in FIG. 2, input lines 208 from a photovoltaic array (e.g., photovoltaic array 102) are coupled to a DC current transducer 212. Although input lines 208 are depicted in the block diagram as a single line for ease of illustration, one skilled in the art will readily appreciate that two conductor lines are coupled to the DC current transducer 212. In a PV energy conversion system 100 that employs a mono-polar PV array 102, the two input lines 208 correspond to the positive and neutral (tied to ground) connections to the PV array 102. And in a PV energy conversion system that employs a bipolar photovoltaic array 102, the input lines 208 correspond to the positive and negative connections of the photovoltaic array 102.

Continuing to refer to FIG. 2, the ground fault detector and interrupter 204 comprises several components, including an amplifier 214, an analog-to-digital (A/D) converter 216 and a controller or digital signal processor 218. As shown the DC current transducer 212 is coupled to the amplifier 214 by connector lines 220, and the amplifier 214 is coupled to the A/D converter 216 by connector lines 222. As depicted, the A/D converter 216 is coupled to the controller or digital signal processor 218 by connector lines 224. Finally, the ground fault detector and interrupter 204 is coupled to the disconnect module 112 (not shown in FIG. 2) of the photovoltaic energy conversion system 100 by lines 210.

Under normal operating conditions, there is little or no difference in the magnitude of current flowing through the pair of input lines 208, but when a ground fault condition arises in the photovoltaic array 102, more current flow will flow on one of the input lines 208 than the other input line, and a current will be induced in a coil 230 of the current transducer 212 so as to create a fault signal that is fed to an input 232 of the current transducer 212. As discussed further herein, in many embodiments, the magnitude of the fault signal is utilized to determine whether a ground fault exists and/or the type of response that is required. In one embodiment, the current transducer 212 has a 100 KHz bandwidth, meant for sensing differential current flowing through the input lines 208. One skilled in the art will readily appreciate that current transducers having different traits and characteristics may be used to achieve the functional capabilities required for the application disclosed herein, depending on the specific implementation and application.

As shown, a signal 220 that is output from the current transducer 212 is amplified by the amplifier 214 to generate an amplified signal 222, which is converted to a digital signal 224 by the A/D converter 216. The controller or digital signal processor 218 then evaluates the digital signal 224 to determine whether a ground fault exists, and if so, whether the ground fault presents a condition that requires interruption of the photovoltaic energy conversion system 100.

In one embodiment, a detected current differential between signal lines 208 of more than 5.0 amperes requires interruption within a specified amount of time from detection; whereas a detected current differential that exceeds 7.5 amperes requires interruption within shorter amount of time from detection; and a detected current differential that exceeds 10 amperes requires interruption at an even shorter amount of time from detection. One skilled in the art will readily appreciate that such current thresholds and timing requirements for triggering interruption depend on the particular circumstances of the photovoltaic energy conversion system 100 in use, the specific compliance codes or regulations applied to the system in operation, or both. If a ground fault is detected and interruption is required, then the controller or digital signal processor 218 sends a signal 210 to actuate a one or more actuators (e.g., in the disconnect module 112) that open the connections between the photovoltaic array 102 and ground and between the photovoltaic array 102 and the system 100, thereby electrically isolating the photovoltaic array and stopping dangerous current flow.

In many embodiments, the ground fault detector and interrupter 204 is a critical operational safety feature of the photovoltaic energy conversion system 100, and thus it must operate correctly at all times that the system 100 is operating. It is possible that one or more components of the ground fault detector and interrupter 204 can fail, causing the ground fault detector and interrupter 204 to fail to detect a differential current indicating a ground fault condition. In such a situation, the photovoltaic energy conversion system 100 would continue to operate, prolonging a dangerous and potentially catastrophic condition.

As shown, in this embodiment a signal generator 226 is utilized in connection with the controller or digital signal processor 218 to realize a ground fault diagnostic function (e.g., that is carried out by the ground fault diagnostics portion 114). In particular, to assess whether the ground fault detector and interrupter 204 is operating properly, an additional signal 228 that is known (e.g., by virtue of being unique and/or having readily identifiable characteristics), which may also be referred to as a diagnostic signal or a reference signal, is supplied to the ground fault detector and interrupter 204 along with the signals induced from the input lines 208. In the embodiment depicted in FIG. 2 for example, the signal 228 is introduced to the coil 230 of the current transducer 230 by passing a signal line through the transducer coil 230. As a consequence, the input 232 of the current transducer 212 includes a combined signal comprising the diagnostic signal (transduced from the additional signal line 228) and the fault signal (transduced from current in lines 208) that propagates through the processing chain 212, 214, 216, 218 of the fault detector 204.

If the diagnostic signal 228 is detected by the controller or digital signal processor 218, which in this embodiment is at the end of processing chain 212, 214, 216, 218, then it may be assumed that the ground fault detector 204 is able to detect differential currents in the input lines 208. In other words, because the additional signal 228 is detected with the same processing chain 212, 214, 216, 218 that detects any current differential in the inputs 208 from the photovoltaic array 102, when the additional signal 228 is detected by the controller or digital signal processor 218, the processing chain 212, 214, 216, 218 is operating as expected. Thus detection of the additional signal 228 by the controller or digital signal processor 218 provides assurance that the ground fault detector and interrupter 204 will detect a ground fault condition if one arises. It is certainly contemplated that in other embodiments, the processing chain 212, 214, 216, 218 includes other components to detect a fault condition, and in these other embodiments the processing chain may still be assessed by detecting propagation of an additional signal through the processing chain.

In the exemplary embodiment shown in FIG. 2, the signal 228 is realized by a signal generator 226 that supplies a 1 kHz sine wave signal but this is certainly not required, and one skilled in the art will readily appreciate that many different electrical signals (e.g., different frequencies) may be supplied by the signal generator 226 to meet this objective.

Figure 3:
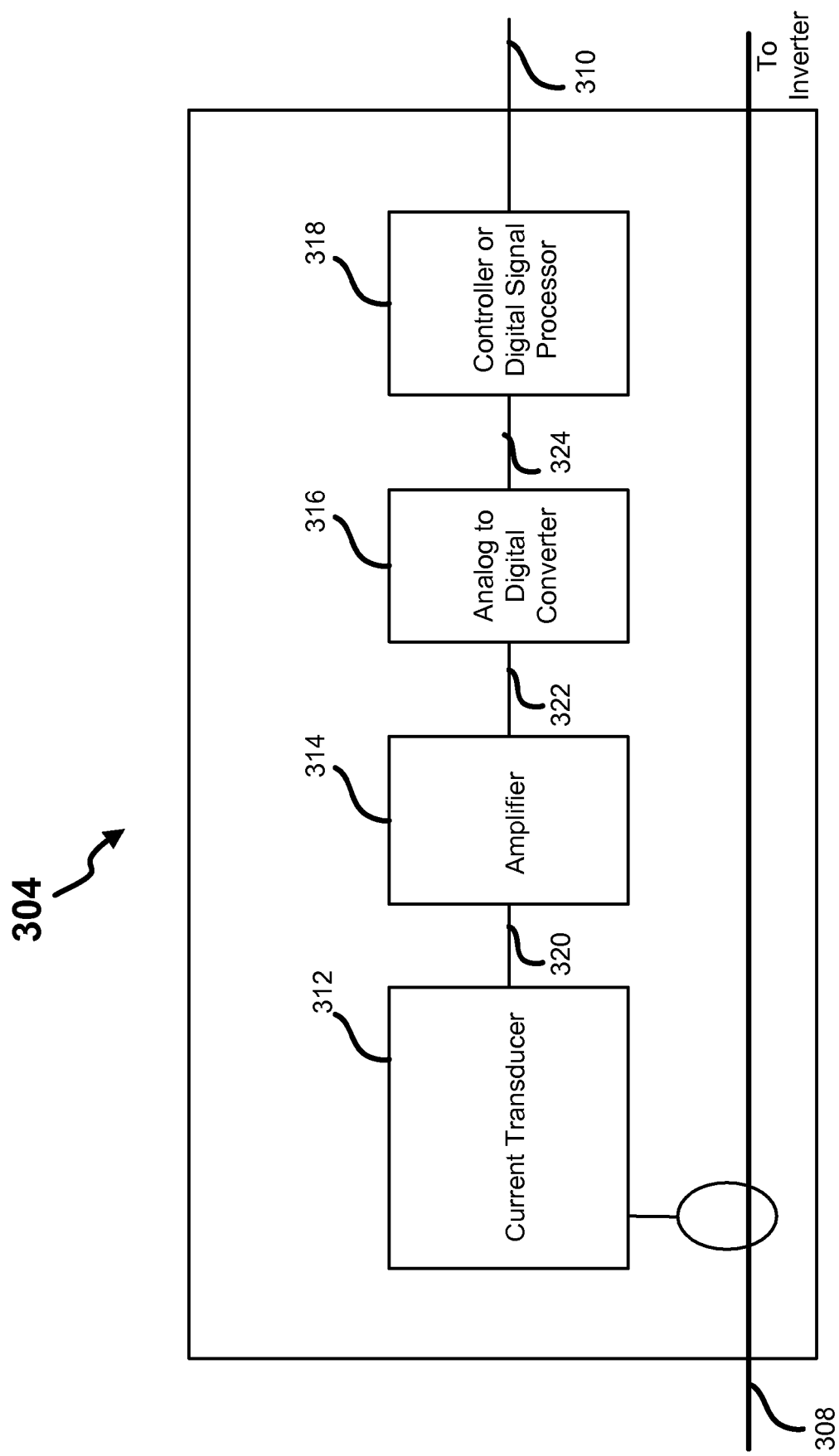
FIG. 3 is a block diagram depicting another exemplary embodiment of the ground fault detector and interrupter described with reference to FIG. 1.

Referring now to FIG. 3, another embodiment is depicted, which uses naturally occurring, common mode parasitic currents that are inherent to the photovoltaic energy conversion system 100 to introduce into the inputs of the ground fault detector and interrupter 304, thereby obviating the need for a separate signal generator 226. Such inherent signals include, for example, parasitic currents of 180 Hz (resulting from 3-phase configurations), 60 Hz (resulting from single phase configurations) and 16 kHz (which corresponds to the switching frequency used in one embodiment). One skilled in the art will readily appreciate that such naturally occurring parasitic currents will vary depending on the specific implementation of a given photovoltaic energy conversion system 100, and that such naturally occurring, common mode, parasitic currents may be used for this purpose.

Figure 4:
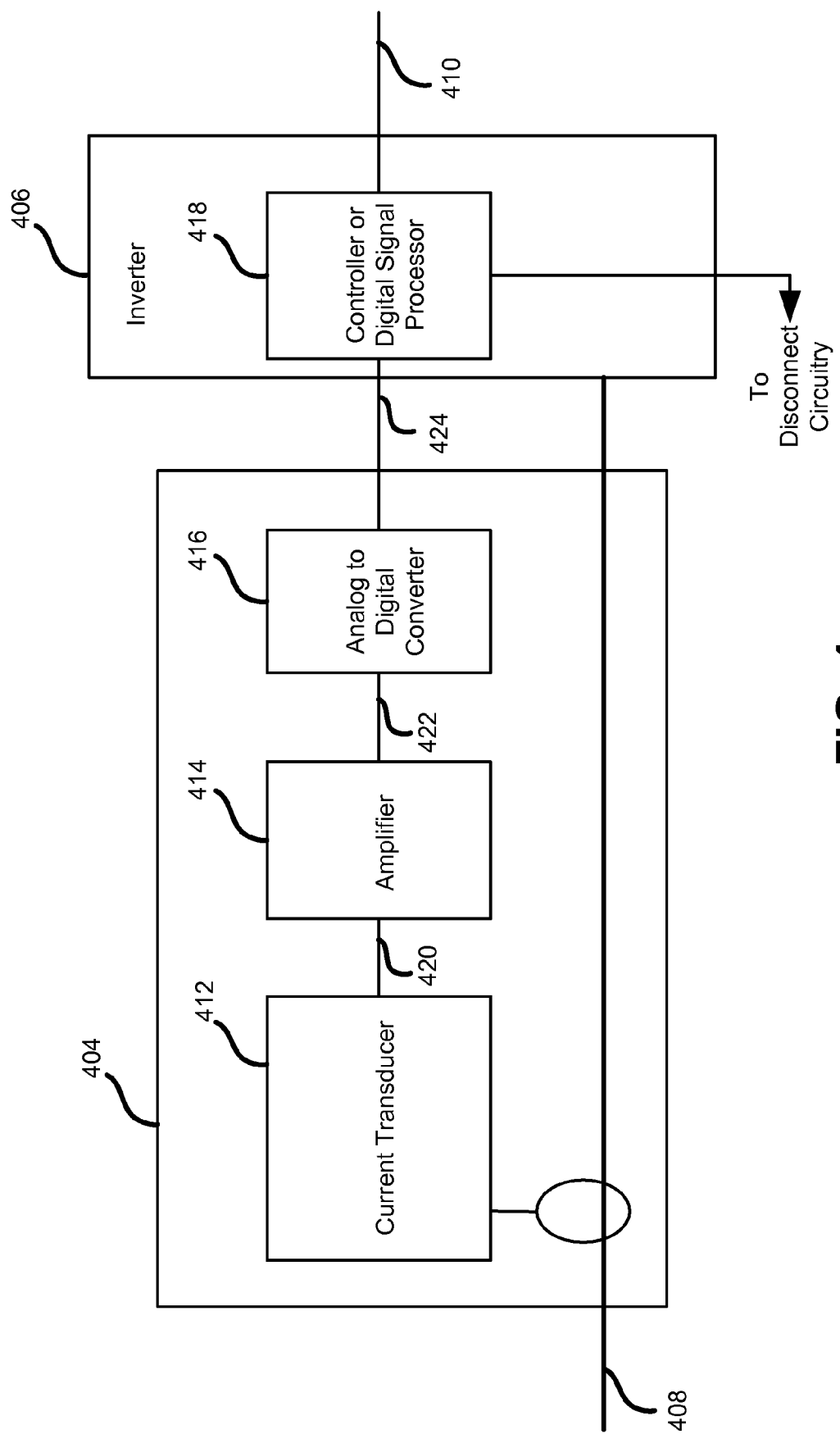
FIG. 4 is a block diagram depicting another exemplary embodiment of the ground fault detector and interrupter described with reference to FIG. 1.

Referring now to FIG. 4, another embodiment is depicted in which a controller or digital signal processor is physically located in the inverter 418 rather than in the ground fault detector and interrupter 404. Functionally, however, the controller or digital signal processor 418 can be shared by both the ground fault detector and interrupter 404 and the inverter 418. Simplicity of design and potential reduction of cost are advantages achieved by the embodiment depicted in FIG. 4 by sharing the functionality of the controller or digital signal processor 418 for applications carried out by both the ground fault detector and interrupter 404 and the inverter 406. In yet other embodiments, the A/D converter 416 and the controller or digital signal processor 418 may be both implemented within the inverter 406. For example, a multi-channel A/D converter 416 may be used in the inverter 406 to convert both current transducer signals and one or more other inputs (e.g., a temperature input) to digital signals.

Figure 5:
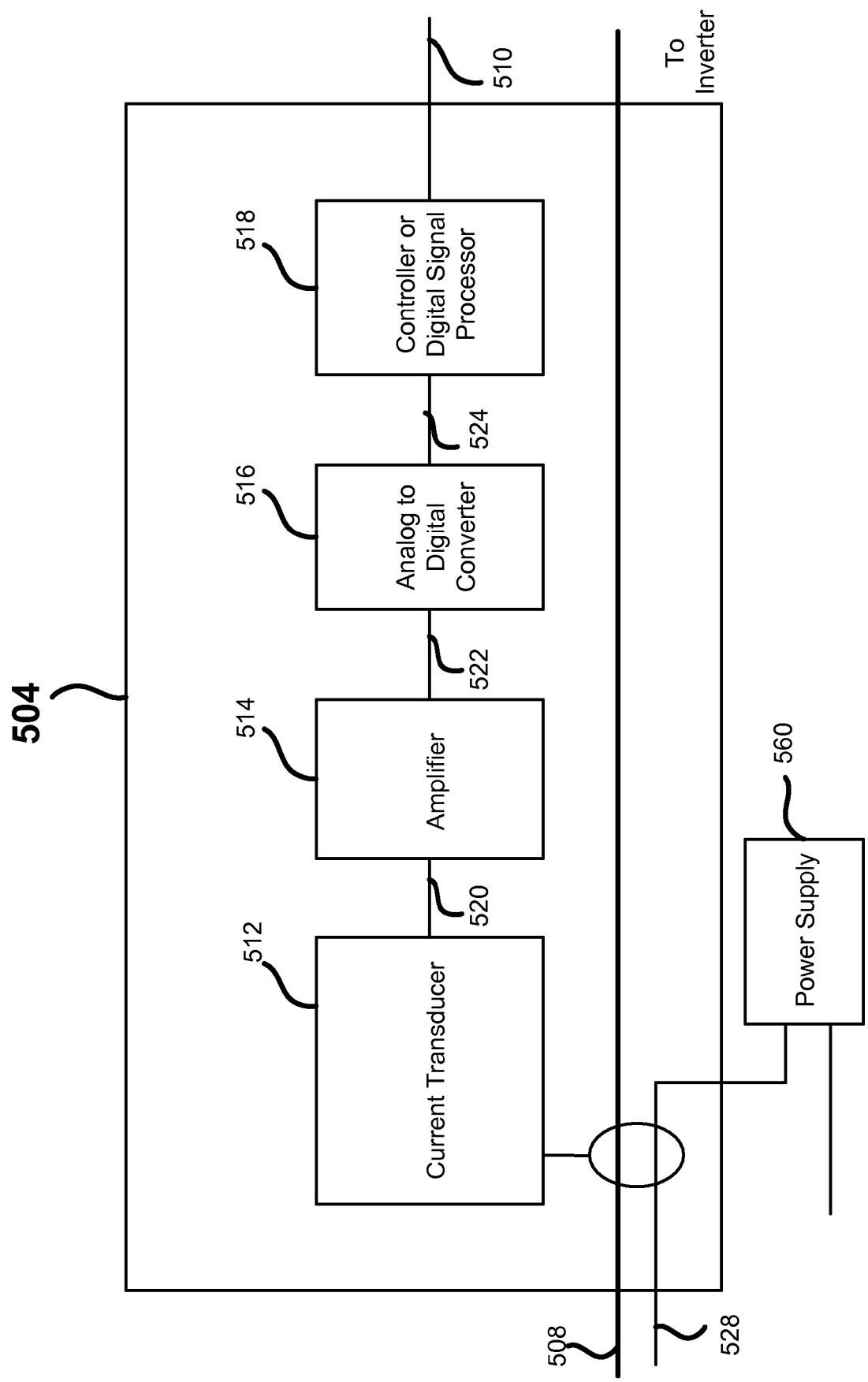
FIG. 5 is a block diagram depicting yet another exemplary embodiment of the ground fault detector and interrupter described with reference to FIG. 1.

Referring now to FIG. 5, shown is another embodiment of a ground fault detector and interrupter 504, which utilizes a reference signal provided by a neutral line 528 feeding a power supply 560, thereby obviating the need for a separate signal generator 226 as depicted in FIG. 2. In this embodiment, the power supply 560 provides power to one or more components of the ground fault detector and interrupter 504 and/or inverter (e.g., inverter 106) (for example, +5V, +12V, +15V and +24V, all relative to ground) for logic processing.

In operation, the frequency of the current in the neutral line 528 (e.g., 60 Hz) is detected by the controller or digital signal processor 518, so long as the chain of fault detection components 512, 514, 516, 518 are functioning properly. In particular, if the fault detection components 512, 514, 516, 518 are functioning properly, DC current transducer 512 produces a signal 520 indicative of both the 60 Hz current and any differential current between the supply lines 508. The signal 520 from the transducer 520 is then amplified by the amplifier 514 to generate an amplified signal 522, and the amplified signal 522 is converted to a digital signal 524 by the A/D converter 516. The digital signal 524 is then filtered by the controller or digital signal processor 518 to detect whether the 60 Hz signal is present. If the 60 Hz signal is present, then the processing chain 512, 514, 516, 518 is functioning properly, and the filtered signal is assessed by the controller or digital signal processor 518 to determine whether the differential current (if any) between lines 508 exceeds a threshold.

If the reference signal (e.g., 60 Hz signal) is not present, then the controller or digital signal processor 518 will initiate action to decouple the photovoltaic array 102 from the PV energy conversion system 100 and from ground by sending a signal 510 (e.g., to disconnect module 112).

Figure 6:
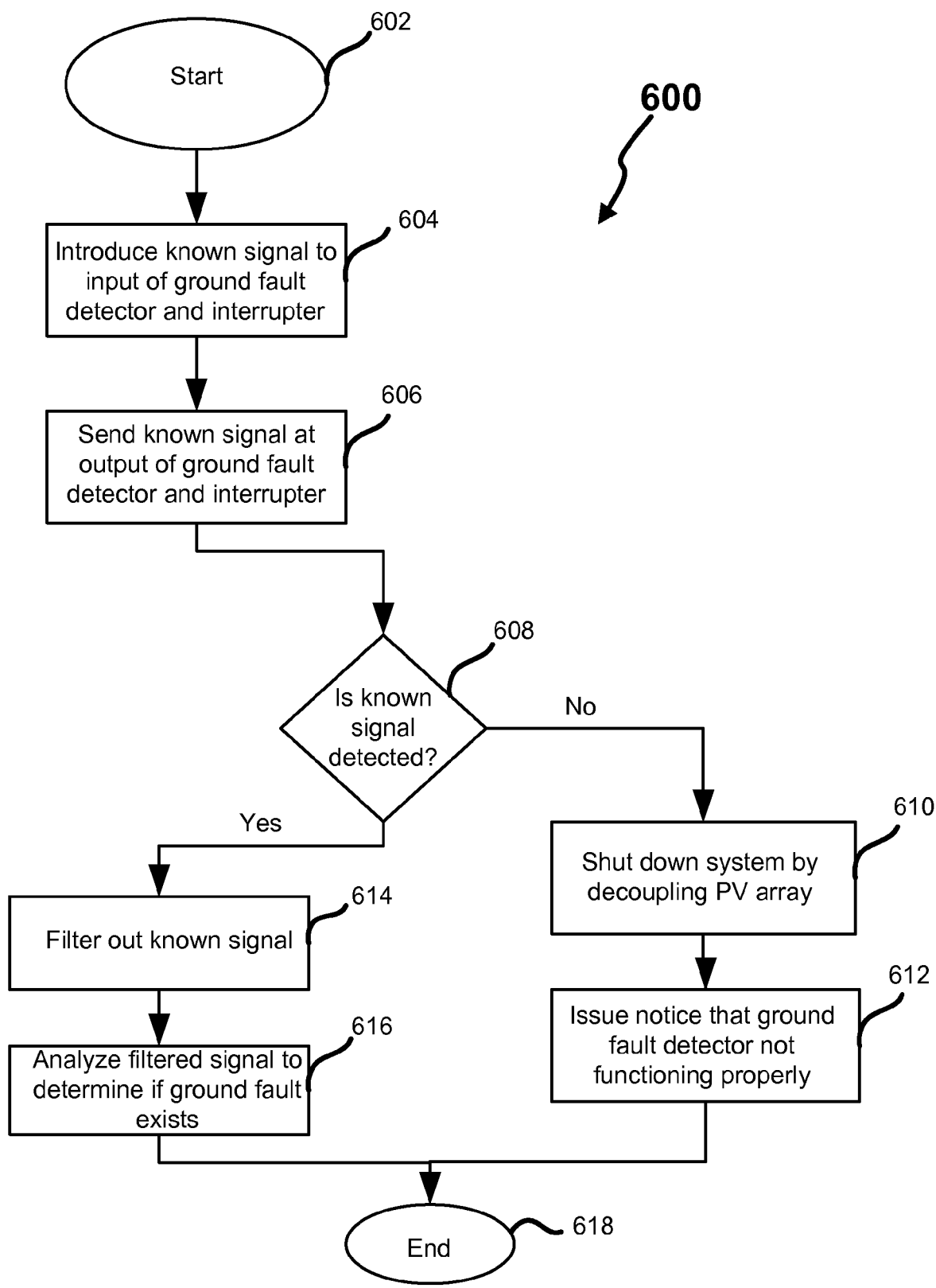
FIG. 6 is a flowchart depicting an exemplary method that may be carried out in connection with the embodiments discussed with reference to FIGS. 1-5.

Referring next to FIG. 6, shown is a flowchart 600 depicting an exemplary method that may be carried out in connection with the embodiments discussed with reference to FIGS. 1-5. As shown at block 604, a known signal (e.g., a signal provided from signal generator 226, a signal inherent to the system 100, a signal provided by power supply 528 or other identifiable signal) is introduced to the input of the ground fault detector and interrupter (e.g., to the current transducer 212, 312, 412, 512) along with a signal indicative of any ground fault within the PV array 102. Next, at block 606, the known signal is sensed (e.g., by the controller or digital signal processor 218) at an end of a processing chain of the ground fault detector and interrupter (e.g. processing chain 212, 214, 216, 218).

As shown, block 608 represents a conditional branch which impacts the flow of the method depending on whether the known signal is detected or not. If the known signal is not detected, then at block 610 the PV energy conversion system 100 is shut down (e.g., by decoupling the PV array 102 from the remaining portions of the system 100 responsive to a signal from controller or digital signal processor 218, 318, 418, 518), and at block 612, a notice is issued (e.g., by controller or digital signal processor 218, 318, 418, 518) indicating the ground fault detector and interrupter 104, 204, 304, 504 is not functioning properly. If the known signal is recognized at block 606, then at block 614 the known signal is filtered out (e.g., by the controller or digital signal processor 218, 318, 418, 518), and at block 616 the filtered signal carrying a signal indicative of any ground fault in the PV array is analyzed to determine whether a ground fault condition exists.

Figure 7:
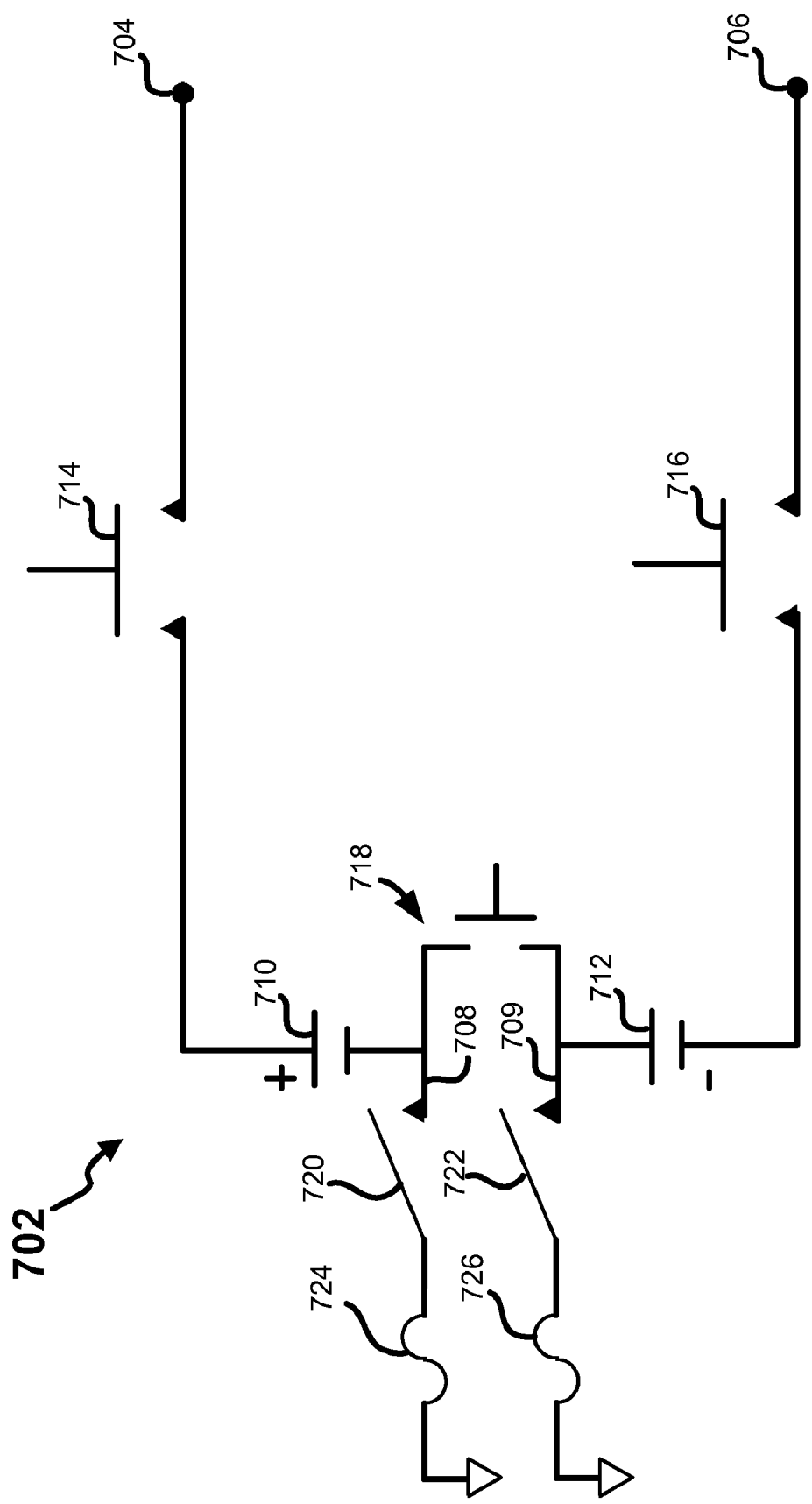
FIG. 7 is a schematic representation depicting an exemplary embodiment of a portion of the system described with reference to FIG. 1.

FIG. 7 is a schematic view of a portion of another embodiment of the photovoltaic energy conversion system 100 comprising a bipolar photovoltaic array 702, and a novel structure and method to decouple the bipolar photovoltaic array 702 once a ground fault condition requiring system interruption is detected. This type of photovoltaic array 702 is commonly referred to as a bipolar connected array: a photovoltaic array that has two rails, such as rails 704 and 706, each rail having opposite polarity relative to ground. This circuit configuration allows, using a first half of the photovoltaic array 710, the generation of a positive voltage relative to ground, and using a second half of the photovoltaic array 712 the generation of a negative voltage relative to ground.

As shown, main DC contactors 714 and 716 are coupled between the PV array 702 and outputs at rails 704 and 706, respectively. The main DC contactors 714, 716 are used to couple and decouple the PV array 702 from the remainder of the photovoltaic energy conversion system (e.g., system 100), and the outputs 704, 706 are typically coupled to an inverter (e.g. inverter 106). A PV tie 718, which may be a DC contactor similar in structure to the main DC contactors 714 and 716, is coupled to the PV array 702 at points surrounding the neutrals 708, 709 of the array, as illustrated in FIG. 7. Auxiliary switches 720 and 722 are also coupled to points surrounding the neutrals of the arrays 708, 709 and to ground. Coupled to each auxiliary switch 720 and 722 are fuses 724 and 726. In one embodiment, the fuses 724 and 726 are rated at 3 amperes; however one skilled in the art will readily appreciate that such fuses may be selected from a wide variety of values based on the particular implementation and codes or regulations that are applied to the system in its installation setting. In one embodiment, the controller or digital signal processor (e.g., 218, 318, 418, 518 not shown in FIG. 7) is coupled to the main DC contactors 714 and 716, the PV tie 718, and the auxiliary switches 720, 722, and is used to set the state (open or closed) of these components.

Electrical codes (such as the National Electrical Code—NEC) that may apply to photovoltaic energy conversion systems 100 in some cases may require that one side of a photovoltaic array be grounded (See, for example, NEC Article 690). This requirement may present a problem when interfacing, for example, with a 120/240 Volt AC utility grid that also requires its neutral point to be grounded. In order to ground both the array and the utility as required by code, photovoltaic systems have commonly employed an isolation transformer (not shown) in the inverter 106 to allow the grounding of both the array and the grid.

When a ground fault condition that requires interruption arises, care must be taken to ensure that the photovoltaic energy conversion system 100 is shut down safely. Such a ground fault condition arises when a fault within one of the halves 710 and 712 of the photovoltaic array 702 occurs, and a special procedure for decoupling the PV array 702 from the system may be followed.

For example, the DC contactors 714 and 716 may be opened first to remove the virtual ground imposed on the arrays 710 and 712 by the action of the inverter. This configuration is called a "virtual ground." The inventors have demonstrated to various testing agencies that this virtual ground configuration stays at or near ground at the conditions and configurations described herein. Once the contactors 714, 716 are opened, the PV tie contactor 718 may be opened so as to isolate the positive and negative arrays 710 and 712. Finally, the neutrals 708, 709 of the arrays 710, 712 are connected to ground with switches 720 and 722. If the ground current is still present, the appropriate fuse 724 or 726 will open; thus interrupting the ground current and preventing hazardous currents from flowing.

Figure 8:
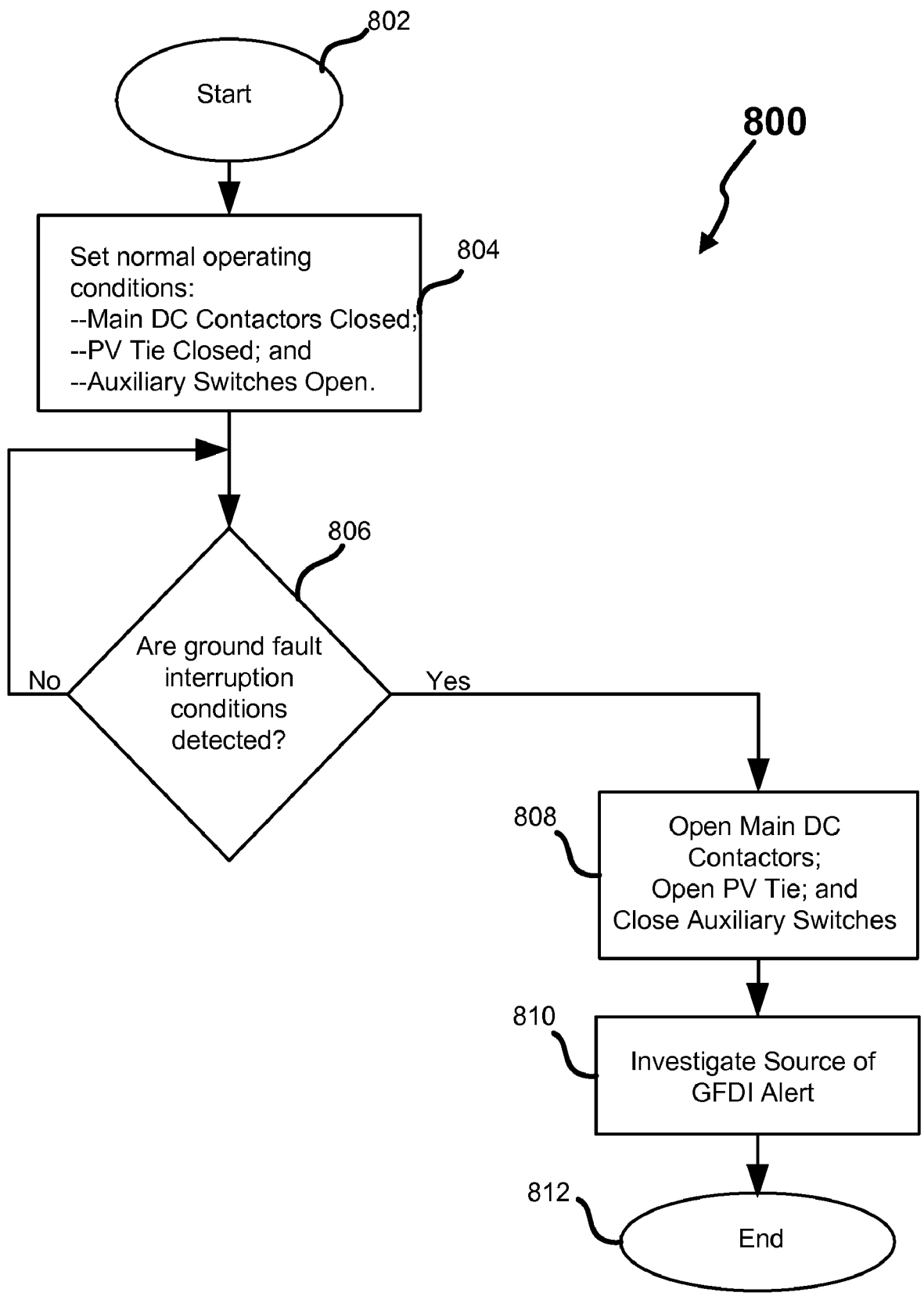
FIG. 8 is a flowchart depicting an exemplary method that may be carried out in connection with the embodiments discussed with reference to FIGS. 1-7.

Referring next to FIG. 8, shown is a flowchart 800 depicting an exemplary method that may be carried out in connection with the embodiment discussed with reference to FIG. 7. In block 804, normal operating conditions are set. Under normal operating conditions (e.g., after the PV energy conversion system 100 has been safely started up), the main DC contactors 714 and 716 are closed to allow current generated from the PV array 702 to flow to the inverter (e.g., 106), the PV tie 718 is closed, and the auxiliary switches 720 and 722 are open. As reflected at block 806, the ground fault detector and interrupter (e.g., 104) continuously operates, as illustrated by the "NO" branch in block 806, to detect ground fault conditions that require system interruption. If a ground fault condition that requires interruption is detected, then the method moves to block 808, where the main DC contactors 714 and 716 are opened, the PV tie contactor 718 is opened, and the auxiliary switches 720 and 722 are closed.

When a ground fault is detected, a ground fault light on the front panel of the inverter may illuminate. As depicted, the method branches to block 810, where actions are taken to investigate the source of the ground fault detection and interruption alert.

One advantage of the structure and method disclosed in FIGS. 7 and 8, respectively, is that they reduce the cost of implementation. By using the PV tie 718 and auxillary switches 720 and 722 to keep the neutrals 708 and 709 at virtual ground, the need to install expensive, heavy gauge neutral wires from the PV array (typically located on a roof or another remote location) to an electrical service panel is avoided. In one embodiment, the controls for the interruption portion and the fuse portion of the ground fault detector and interrupter (e.g., 104) is enclosed in a small block that it is mounted on a sub-chassis. That sub-chassis can be easily installed up on the roof or where ever the PV array 702 is physically located. Although heavy duty wires must be connected to the sub-chassis, but only light duty wires need to run down to the inverter.

In conclusion, the present invention provides, among other things, a system and method for detecting ground fault conditions that require system interruption of a photovoltaic energy conversion system. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claim is:
1. A photovoltaic energy conversion system comprising:
a photovoltaic array configured to generate a direct current (DC) power, where the photovoltaic array comprises a first rail and a second rail;
an inverter configured to convert the DC power into alternating current (AC); and
a ground fault detector and interrupter coupled to the first and the second rails of the photovoltaic array, the ground fault detector and interrupter configured to detect a diagnostic signal and ground fault conditions in the photovoltaic array, and to interrupt operation of the photovoltaic energy conversion system when either a ground fault condition is detected or when the diagnostic signal is not detected, the ground fault detector and interrupter including:
a current transducer configured to receive the diagnostic signal and to couple to the first and second rails of the photovoltaic array so as to enable the current transducer to sense a differential current between the first and second rails, and wherein the current transducer is configured to both transduce the diagnostic signal on to a processing chain and transduce a fault-detection signal on to the processing chain, the fault detection signal being indicative of the differential current between the first and second rails of the photovoltaic array; and
a controller configured to detect the diagnostic signal and the fault-detection signal.

2. The system of claim 1, including:
an analog to digital converter configured to convert the diagnostic signal into a digital diagnostic signal and the fault detection signal into a digital fault detection signal;
wherein the controller includes a digital signal processor configured to detect both the digital diagnostic signal and the digital fault detection signal.

3. The system of claim 1, including a signal generator configured to generate the diagnostic signal.

4. The system of claim 3, wherein the signal generator is configured to generate a 1 KHz signal.

5. The system of claim 1, wherein the diagnostic signal comprises one or more common mode, parasitic currents inherent to the photovoltaic system.

6. The system of claim 1, wherein the diagnostic signal comprises a signal generated from a power supply, the power supply providing power to at least a portion of the ground fault detector and interrupter.

7. A method for detecting failure of a ground fault detector comprising:
supplying a fault signal to an input of the ground fault detector, the fault signal generated from a photovoltaic energy conversion system;
combining a known signal with the fault signal at the input of the ground fault detector so as to create a combined signal;
detecting whether the known signal is present in the combined signal at an end of a processing chain of the ground fault detector; and
if the known signal is present, assessing whether the power signal indicates the presence of a ground fault, and if the known signal is not present, interrupting operation of the photovoltaic energy conversion system, wherein interrupting operation of the photovoltaic energy conversion system includes decoupling a plurality of DC contactors to electrically isolate a photovoltaic array of the photovoltaic energy conversion system from an inverter of the photovoltaic energy conversion system.

8. A photovoltaic energy conversion system comprising:
a bipolar photovoltaic array including a first PV array disposed between a first rail and a first neutral and a second PV array disposed between a second neutral and a second rail, the first PV array configured to apply, relative to a potential of ground, a positive potential at the first rail, and the second PV array configured to apply, relative to ground, a negative potential at the second rail;
a first DC contactor coupled to the first rail, and a second DC contactor coupled to the second rail;
a PV tie coupled at a first point between the first PV array and the first neutral, and coupled at a second point between the second PV array and the second neutral; and
a first auxiliary switch coupled between the first neutral and ground, and a second auxiliary switch coupled between the second neutral and ground.

9. The photovoltaic energy conversion system of claim 8 comprising a controller coupled to, and configured to control, the first and second DC contactors, the PV tie and the first and second auxiliary switches.

10. The photovoltaic energy conversion system of claim 8 wherein the controller comprises a digital signal processor.

11. The photovoltaic energy conversion system of claim 8 including a first fuse coupled between the first auxiliary switch and ground and a second fuse coupled between the second auxiliary switch and ground.

12. A method for interrupting a photovoltaic energy conversion system that employs a bipolar photovoltaic array, the method comprising:
detecting a condition that requires interruption of the photovoltaic energy conversion system;
opening a PV tie to uncouple two PV arrays of the bipolar photovoltaic array, thereby decoupling the two PV arrays from a virtual ground;
after the PV tie is opened, opening a plurality of main DC contactors and closing a plurality of auxiliary switches thereby decoupling the bipolar photovoltaic array from a remainder portion of the energy conversion system and shunting current resulting from a ground fault in the bipolar photovoltaic array through one of the auxiliary switches.

13. The method of claim 12 further comprising:
detecting whether a fuse has been triggered;
repairing or replacing the bipolar photovoltaic array if a fuse is triggered; and
investigating the cause of the detected condition if the fuse is not triggered.

14. The method of claim 7 wherein interrupting operation of the photovoltaic energy conversion system includes issuing an alert that the ground fault detector is not operating properly.

15. An apparatus for interrupting a photovoltaic energy conversion system that employs a bipolar photovoltaic array, The apparatus comprising:
a ground fault detector and interrupter configured to be coupled to the first and the second rails of the photovoltaic array, the ground fault detector and interrupter configured to detect a condition that requires interruption of the photovoltaic energy conversion system and open a PV tie to uncouple two PV arrays of the bipolar photovoltaic array, thereby decoupling the two PV arrays from a virtual ground; and
a controller configured to, after the PV tie is opened, open a plurality of main DC contactors and closing a plurality of auxiliary switches thereby decoupling the bipolar photovoltaic array from a remainder portion of the energy conversion system and shunting current resulting from a ground fault in the bipolar photovoltaic array through one of the auxiliary switches.

* * * * *